(12) United States Patent
Mangat et al.

(10) Patent No.: US 6,177,354 B1
(45) Date of Patent: Jan. 23, 2001

(54) METHOD OF ETCHING A SUBSTRATE

(75) Inventors: Pawitter Jit Singh Mangat, Chandler; Philip Armin Seese, Phoenix; William Joseph Dauksher, Mesa, all of AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/389,640

(22) Filed: Sep. 3, 1999

Related U.S. Application Data

(62) Division of application No. 08/929,686, filed on Sep. 15, 1997, now Pat. No. 6,039,835.

(51) Int. Cl.$^7$ .................................................. H01L 21/302
(52) U.S. Cl. ............................ 438/710; 438/745; 156/345
(58) Field of Search .................................... 438/706, 745; 156/345

(56) References Cited

U.S. PATENT DOCUMENTS

| | | | |
|---|---|---|---|
| 4,165,252 | * | 8/1979 | Gibbs ..................................... 156/655 |
| 4,600,463 | * | 7/1986 | Aigo ....................................... 156/345 |
| 5,014,737 | * | 5/1991 | Berman ................................. 137/334 |
| 5,500,081 | * | 3/1996 | Bergman ............................ 156/646.1 |
| 5,578,167 | * | 11/1996 | Sooriakumar et al. ............ 156/654.1 |

* cited by examiner

Primary Examiner—Terrel Morris
Assistant Examiner—Norca L. Torres-Velazquez
(74) Attorney, Agent, or Firm—A. Kate Huffman

(57) ABSTRACT

A etcher (10) has an inner chamber (22) that is in communication with a collection chamber (17). A cover (33) is made from a substrate (11) and an outer housing (34). The cover (33) is attached to the etcher (10) so that the substrate (11) is suspended over the inner chamber (22). A recirculating system (29) is used to pass an etchant through a filter, into the inner chamber (22), across the substrate (11), into the collection chamber (17), and into a reservoir.

13 Claims, 1 Drawing Sheet

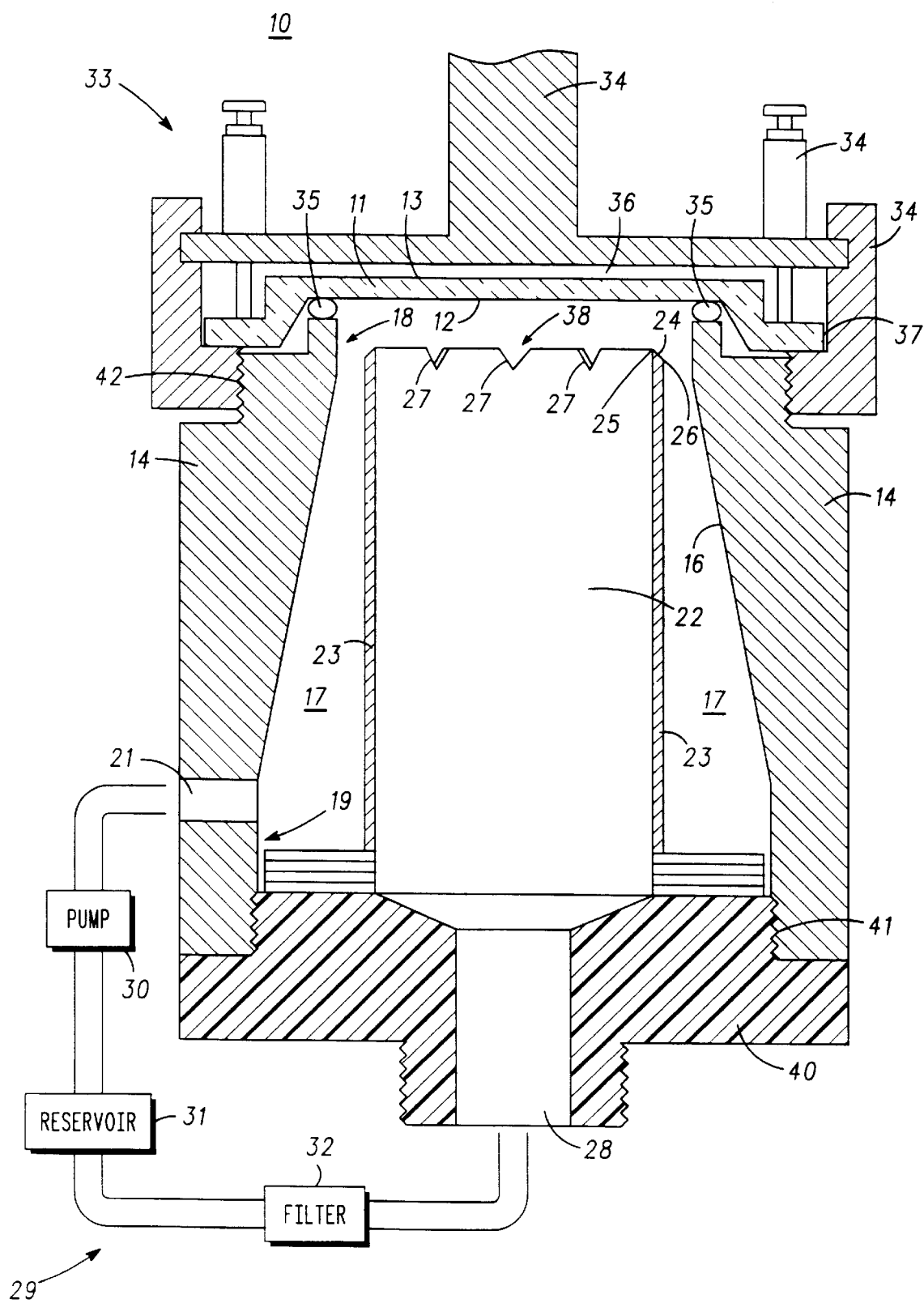

METHOD OF ETCHING A SUBSTRATE

This application is a division of Ser. No. 08/929,686 filing date Sep. 15, 1997 now U.S. Pat. No. 6,039,835.

BACKGROUND OF THE INVENTION

This invention relates, in general, to semiconductor devices, and more particularly, to the etching and patterning of substrates or lithographic masks.

X-ray lithographic masks typically comprise a thin membrane that is less than 10 microns thick. An X-ray lithographic mask is conventionally formed by depositing a membrane film such as silicon carbide over all surfaces of a silicon substrate. The silicon carbide film on the bottom side of the silicon substrate is lithographically defined to create a window or to create a plurality of windows, and the silicon carbide film is removed from the window or the plurality of windows to expose the underlying silicon substrate. The exposed portion of the silicon substrate may be etched via simple immersion or by immersion in concert with an immersion fixture. The substrate is immersed in an etchant to remove the exposed portion of the silicon substrate, thereby creating a freestanding membrane film of silicon carbide. This immersion technique, however, is not practical for high volume manufacturing operations because the thin membrane film is easily damaged when the X-ray lithographic mask is placed in or removed from the immersion holders. If immersion fixtures are not used, sacrificial protective layers typically are necessary to protect the front side of the substrate. However, formation and removal of the sacrificial protective layer requires additional processing steps, which decreases throughput. The formation and removal of the sacrificial protective layer additionally results in a large number of defects. If immersion fixtures are used, extra manual handling is essential, but the manual handling compromises operator safety and increases defects. Another drawback of the immersion technique is that the etch bath containing the etchant solution can become contaminated with particles that result from the etching of the silicon substrate. Furthermore, the prior art immersion techniques are not suitable for the manufacturing of very thin membrane structures, such as projection electron beam lithography masks which are fragile in nature.

Accordingly, it would be advantageous to provide an apparatus that can be used to form a lithographic mask that is less likely to damage the thin membrane of the mask. It would also be advantageous if the apparatus reduced the number of particulates in the etch solution, and thus, was more suitable for high volume semiconductor device manufacturing. It would also be advantageous to provide higher throughput and to increase operator safety. An additional advantage would be to provide a manufacturing process suitable for extremely thin and fragile membrane structures.

BRIEF DESCRIPTION OF THE DRAWING

The single FIGURE is a cross-sectional view of an etcher in accordance with the present invention.

It will be appreciated that for simplicity and clarity of illustration, elements illustrated in the FIGURE art not necessarily drawn to scale. For example, the dimensions of some of the elements are exaggerated relative to other elements for clarity.

DETAILED DESCRIPTION OF THE DRAWING

The single FIGURE is a cross-sectional view of an apparatus or an etcher 10 that can be used in the processing of a substrate 11. In general, etcher 10 provides a way of exposing a bottom surface or side 12 of substrate 11 to a liquid, vapor, or gaseous etchant while protecting a top surface or side 13 of substrate 11 from the etchant. More particularly, substrate 11 can be, but is not restricted to, a photolithographic mask, an ion-beam lithographic mask, an X-ray lithographic mask, or a projection electron beam lithographic mask. These types of lithographic masks are then used to define patterns on semiconductor substrates (not shown) using semiconductor processing techniques well known in the art to form semiconductor devices.

Alternatively, substrate 11 can be a semiconductor substrate such as silicon, gallium arsenide, or the like, and etcher 10 can be used to define structures on the bottom side 12 of substrate 11. For example, if substrate 11 is a silicon substrate, etcher 10 can be used to form cavities for sensor structures or to pattern layers of dielectric or metallic material without damaging top side 13.

Etcher 10 has a wall 14 having an inner surface 16 that defines a collection cavity or chamber 17. As shown in the FIGURE, the inner surface 16 of wall 14 is preferably tapered from an upper end 18 of wall 14 to a lower end 19 of wall 14 wherein upper end 18 is closer tank 23 than lower end 19. The tapered profile of wall 14 promotes the flow of etchant through etcher 10 and reduces the amount of pressure on the bottom side 12 of substrate 11 that may result from excess etchant in collection chamber 17. Wall 14 of etcher 10 also has an output port 21 near the lower end 19 of wall 14. Output port 21 is used to remove etchant and by-product gases from collection chamber 17 as explained shortly.

Etcher 10 also includes an inner cavity or chamber 22, which is provided or defined by an inner supply tank 23 contained within collection chamber 17. Tank 23 has a rim 24 with an inner edge 25 and an outer edge 26, the inner edge 25 being higher than the outer edge 26 as shown in the FIGURE. Thus, rim 24 of tank 23 has a sloped surface to promote the flow of an etchant across the bottom side 12 of substrate 11. As shown in the FIGURE, rim 24 defines opening 38 and can have a plurality of grooves 27, which promote the flow of etchant from the inner chamber 22 over rim 24 of supply tank 23 and into collection chamber 17. Additionally, rim 24 of supply tank 23 is parallel to the bottom side 12 of substrate 11, and the upper end 18 of wall 14 extends beyond or is higher than rim 24 of supply tank 23 to optimize the etching of substrate 11. Supply tank 23 has an input port 28, which is used to provide etchant into inner chamber 22.

Etcher 10 also has a recirculating system 29 which can include a pump, a reservoir, and a filter, which are represented in the FIGURE as boxes 30, 31, and 32, respectively. Recirculating system 29 couples input port 28 to output port 21 to provide a closed system with inner chamber 22 and collection chamber 17. As an example, an etchant such as potassium hydroxide is pumped from the reservoir and added into inner chamber 22 through input port 28. Once supply tank 23 is filled with etchant, the etchant flows over rim 24 and is collected in collection chamber 17. The configuration of etcher 10 also places the bottom side 12 of substrate 11 in contact or in communication with the etchant flowing out of inner chamber 22 so that etchant is directed from inner chamber 22 onto the bottom side 12 of substrate 11. The etchant is then removed from collection chamber 17 via output port 21 and passed through recirculating system 29, including the filter, before returning to supply tank 23. It should be understood that recirculating system 29 need not necessarily include a pump, a filter, and a reservoir and that other configurations for recirculating system 29 are possible.

Etcher 10 also includes a cover 33, which can be made of substrate 11 and an outer housing 34. A variety of techniques can be used to attach outer housing 34 to substrate 11 such as springs, clamps, screws, or the like. The upper end 18 of wall 14 has a threaded portion 42 so that cover 33 can be adjustably mounted to wall 14. Threaded portion 42 of wall 14 permits etcher 10 to accommodate different thicknesses and geometries for substrate 11. Once cover 33 is coupled to wall 14, collection chamber 17 and inner chamber 22 are isolated from an ambient surrounding etcher 10.

Etcher 10 also includes a base plate 40, which is coupled to or adjustably mounted to a threaded portion 41 at lower end 19 of wall 14. Threaded portion 41 permits the raising or lowering of wall 14 with respect to supply tank 23, thus enabling the control of space between rim 24 and bottom side 12 of substrate 11. This allows substrate 11 to be disposed or suspended over inner chamber 22 at a distance that can be easily adjusted. Preferably, substrate 11 is separated from inner chamber 22 by a distance of less than about 5 millimeters.

As shown in the FIGURE, outer housing 34 is configured so that cover 33 has a sealed cavity 36 over the top side 13 of substrate 11. Sealed cavity 36 is isolated from collection chamber 17 and inner chamber 22 in part by a seal 35, which can be positioned between the bottom side 12 of substrate 11 and the upper end 18 of wall 14. Seal 35 protects top side 13 of substrate 11 from liquid or gas flowing through inner chamber 22 and collection chamber 17. Seal 35 is preferably an o-ring, a gasket, a vacuum seal, or the like. However, it should be understood that other sealing means may be used to isolate the top side 13 of substrate 11 from the etchant in inner chamber 22 and collection chamber 17. Sealed cavity 36 isolates and protects the top side 13 of substrate 11 from airborne contaminants.

As etchant from inner chamber 22 passes across the bottom side 12 of substrate 11, substrate 11 is etched and a gas by-product may result. For example, if potassium hydroxide is used to etch a silicon substrate, a hydrogen gas by-product results. The hydrogen gas flows into collection chamber 17 and then is removed from etcher 10 using output port 21.

As described above, etcher 10 is configured so that substrate 11 is over opening 38 and has an edge 37 that extends beyond rim 24 of supply tank 23. Preferably, substrate 11 and inner chamber 22 are concentric to each other to optimize the flow of etchant across the bottom side 12 of substrate 11. It is also possible to configure etcher 10 such that collection chamber 17 contains a plurality of inner chambers that each have an input port and are coupled to recirculating system 29. This may be desirable for large substrate or for etching several substrates at the same time. One advantage the present invention has over immersion etchers is that the size of opening 38 of supply tank 23 can be designed so that only a portion of the bottom side 12 of substrate 11 is etched. In other words, the entire bottom side 12 of substrate 11 need not be exposed to etchant during the operation of etcher 10. The surface area of substrate 11 that is etched can be adjusted by the flow rate of the etchant, the slope of rim 24, size of opening 38 of supply tank 23, the relative angle of the bottom side 12 of substrate 11 to rim 24, and the distance between substrate 11 and supply tank 23.

In one embodiment where the etchant within etcher 10 is a liquid, the flow of the liquid etchant can be reduced and controlled such that the etchant is no longer in contact with or is now devoid of contacting bottom side 12 of substrate 11. In this embodiment, the distance between bottom side 12 of substrate 11 and rim 24 is preferably at least five millimeters. Also in this embodiment, the vapor from the liquid etchant contacts bottom side 12 of substrate 11 and provides the etching mechanism. The advantages of this embodiment include precisely controllable etch rates and reduced pressure on membranes formed in substrate 11. The reduced pressure is especially advantageous for the manufacturing of projection electron beam lithographic masks, which are extremely fragile.

By now it should be appreciated that there has been disclosed an improved etcher that can be used in the manufacture of lithographic masks and semiconductor substrates. The etcher reduces the amount of particulates in the etch solution by recirculating the etch solution through a filter and can be automated to reduce the amount of handling compared to immersion techniques. This in turn reduces the number of defects that are formed on the mask, which improves the yield of semiconductor devices manufactured using the mask. The etcher also provides a flow of filtered etchant across the surface of a substrate so that the etch process can be significantly better controlled than conventional immersion techniques. The etcher likewise obviates the need for forming a protective mask on a substrate to protect portions of the substrate from the etchant. Furthermore, the etcher does not require the use of sacrificial layers and increases the throughput and yield. Moreover, the etcher improves operator safety because of the reduction in manual handling.

What is claimed is:

1. A method of forming a semiconductor device comprising the steps of:

providing an etcher having a first chamber and a second chamber;

disposing a substrate overlying the second chamber, wherein the substrate has an edge, a first surface, and a second surface;

suspending a cover over the first chamber and the second chamber to isolate the first chamber and the second chamber from an ambient surrounding the chambers;

directing etchant from the second chamber so that at least a portion of the etchant is in contact with at least a portion of the first surface of the substrate;

providing a sealed cavity over the second surface of the substrate to isolate the second surface from the etchant in the first and the second chambers; and collecting the etchant in the first chamber.

2. The method of claim 1 wherein the step of providing the etcher includes providing the second chamber within the first chamber.

3. The method of claim 1 further comprising the steps of:

passing the etchant from the first chamber through a filter; and passing the etchant from the filter into the second chamber.

4. The method of claim 1 wherein the step of disposing the substrate includes providing a lithographic mask, and wherein the method further comprises using the lithographic mask to define patterns on the semiconductor device.

5. The method of claim 1 wherein the step of directing an etchant includes adding a liquid etchant to the second chamber, thereby creating a gas in the first chamber, and the method further comprises the step of removing a portion of the gas from the first chamber.

6. The method of claim 5 wherein the step of disposing the substrate includes disposing a substrate comprising silicon, wherein the step of adding the liquid etchant includes providing potassium hydroxide for the liquid etchant, and wherein the step of directing the etchant includes creating hydrogen gas.

7. The method of claim 1 wherein the step of disposing the substrate includes disposing the substrate so that the second surface of the substrate is isolated from the second chamber.

8. The method of claim 7 wherein the step of directing the etchant includes the step of protecting the second surface of the substrate from the etchant.

9. The method of claim 1 wherein the step of directing the etchant includes providing a liquid for the etchant and wherein the method further comprises using a vapor from the etchant to etch the substrate.

10. The method of claim 9 wherein the step of using the vapor includes increasing a distance between the substrate and the second chamber.

11. The method of claim 9 wherein the step of using the vapor includes reducing a flow rate of the etchant such that the etchant is devoid of contacting the substrate.

12. The method of claim 1 further comprising recirculating the etchant from the first chamber into the second chamber after collecting the etchant in the first chamber.

13. The method according to claim 1, further comprises disposing the substrate over the second chamber wherein the substrate is concentric to the second chamber.

* * * * *